(12) United States Patent
Fujimori

(10) Patent No.: US 9,236,974 B2
(45) Date of Patent: Jan. 12, 2016

(54) DATA RECEIVER AND FAIL-SAFE CIRCUIT

(71) Applicant: MegaChips Corporation, Osaka (JP)

(72) Inventor: Yasuhiro Fujimori, Chiba (JP)

(73) Assignee: MegaChips Corporation, Osaka (JP)

(*) Notice: Subject to any disclaimer, the term of this patent is extended or adjusted under 35 U.S.C. 154(b) by 0 days.

(21) Appl. No.: 14/553,814

(22) Filed: Nov. 25, 2014

(65) Prior Publication Data

US 2015/0146772 A1 May 28, 2015

(30) Foreign Application Priority Data

Nov. 25, 2013 (JP) ................................. 2013-242684

(51) Int. Cl.
*H04L 1/00* (2006.01)
*H04B 1/12* (2006.01)

(52) U.S. Cl.
CPC ................ *H04L 1/0002* (2013.01); *H04B 1/12* (2013.01)

(58) Field of Classification Search
CPC ............ H04L 1/0002; H04L 25/03834; H04L 27/2064; H04L 27/2017; H04B 1/12; H04B 10/12; H04B 1/0003; H04B 1/0014; H04B 1/0021; H04B 1/0039; H04B 1/26; H04B 1/40; H04B 1/406; H04B 3/02
See application file for complete search history.

(56) References Cited

U.S. PATENT DOCUMENTS

| 2005/0141158 A1* | 6/2005 | Sae-Ueng et al. ........... 361/91.1 |
| 2007/0173216 A1* | 7/2007 | Blum ............................ 455/212 |
| 2010/0329391 A1* | 12/2010 | Fukuda et al. ................ 375/319 |
| 2012/0191996 A1* | 7/2012 | Cheong ......................... 713/320 |
| 2012/0196555 A1* | 8/2012 | Igarashi ................... H04B 1/30 455/341 |
| 2013/0140276 A1* | 6/2013 | Morita ................... B23H 1/024 219/69.13 |
| 2014/0006652 A1* | 1/2014 | Chen .................... G06F 11/3051 710/16 |
| 2014/0016404 A1* | 1/2014 | Kim ...................... G11C 11/165 365/158 |

FOREIGN PATENT DOCUMENTS

JP  2010-034733 A  2/2010

* cited by examiner

*Primary Examiner* — Hirdepal Singh
(74) *Attorney, Agent, or Firm* — Osha Liang LLP

(57) ABSTRACT

A data receiver has a reception circuit and a fail-safe circuit. The reception circuit has an input amplifier, a logic signal processing circuit, and a reception stop control circuit. The fail-safe circuit has a high-pass filter, a comparator, and a pulse width extending circuit. The reception circuit receives a serial data of differential input signals based on a predetermined standard, converts the serial data into a serial data of a single-ended output signal, and outputs a converted serial data. The fail-safe circuit detects whether the differential input signals have a nonstandard small amplitude and outputs a fail-safe detection signal indicating a detection result.

13 Claims, 5 Drawing Sheets

ID_RECEIVER AND FAIL-SAFE CIRCUIT

CROSS-REFERENCE TO RELATED APPLICATIONS

The present application claims priority under 35 U.S.C. §119 to Japanese Patent Application No. 2013-242684, filed Nov. 25, 2013. The priority application is hereby expressly incorporated by reference, in its entirety, into the present application.

BACKGROUND OF THE INVENTION

The present invention generally relates to a data receiver that receives serial data of differential input signals based on a low voltage differential signaling (LVDS) standard and outputs serial data of a single-ended output signal, and a fail-safe circuit that is used in the data receiver, and detects whether or not the differential input signals have nonstandard small amplitude.

The LVDS is a serial interface technique for transmitting data at a high speed from a data transceiver to a data receiver. In a data transmission system using the LVDS, serial data of differential output signals based on an LVDS standard is transmitted from the data transceiver to the data receiver. In the data receiver, serial data of differential input signals transmitted from the data transceiver is received, converted into serial data of a single-ended output signal, and supplied to a processing circuit which processes the serial data.

In a data reception circuit for the LVDS, in a case where differential input signals with nonstandard small amplitude not based on the predetermined amplitude of the LVDS standard are received (in other words, when a failure occurs in the amplitude of the differential input signals), a fail-safe function is needed.

JP 2010-34733 A discloses a squelch detection circuit. The squelch detection circuit includes a peak detection circuit and a pulse width extending circuit. When the potential amplitude of received differential signals exceeds a predetermined value, the peak detection circuit outputs a voltage signal corresponding to a difference between the differential signals, outputs a shift reference voltage obtained by level-shifting an intermediate potential between first and second reference voltages, compares the voltage signal with the shift reference voltage, and outputs a detection signal thereof as a pulse. The pulse width extending circuit extends the pulse width of the detection signal by at least one period of the differential signals.

SUMMARY OF THE INVENTION

The squelch detection circuit illustrated in FIG. 1 of JP 2010-34733 A is suitable for high-speed data communication, but is difficult to make without increasing an area in a band of several tens of MHz or less, which is handled by the data receiver for the LVDS.

This is because 1000 or more conventional inverters are required, for example, in a band of 20 MHz in order to extend a pulse width by about one period in the pulse width extending circuit.

In addition, the squelch detection circuit illustrated in FIG. 7 of JP 2010-34733 A has low (dull) sensitivity to detecting normal amplitude or small amplitude (a circuit configuration in which determination of normal operation or fail-safe operation is performed only after a same result as a normal amplitude or a small amplitude repeats several times with respect to normal amplitude/small amplitude determination), and thus is not suitable for a data reception circuit for LVDS, which requires high (sharp) sensitivity to normal amplitude (as soon as normal amplitude is detected once, normal operation applies). For example, if there are several hundreds of the inverters INV 21, they cannot be used as part of the LVDS data reception circuit without substantially increasing the area of the circuit.

In addition, diodes or resistors are redundant. The usage of the diodes imposes an upper limit of output voltage in a case of a low voltage specification.

Further, although a hysteresis amplifier is used as a comparator, the amplifier has difficulties corresponding to a low voltage, reducing power consumption, and achieving minimized area, and the amplifier is easily influenced by a process variation (this widens a gray zone which is a range of a threshold value for normal amplitude/small amplitude determination of differential input signals).

Advantageously, one or more embodiments of the present invention provide a data receiver that receives differential input signals based on a given standard and a fail-safe circuit capable of preventing malfunction when the data receiver receives differential input signals of nonstandard small amplitudes.

A data receiver according to one or more embodiments of the present invention comprises:

a reception circuit that receives a serial data of differential input signals based on a predetermined standard, converts the serial data into a serial data of a single-ended output signal, and outputs a converted serial data; and a fail-safe circuit that detects whether the differential input signals have a nonstandard small amplitude, and outputs a fail-safe detection signal indicating a detection result thereof, wherein the reception circuit comprises:

an input amplifier portion that receives the serial data of the differential input signals, converts the serial data into the serial data of the single-ended output signal, and outputs the converted serial data;

a logic signal processing circuit that processes the converted serial data; and a reception stop control circuit that disables the input amplifier and the logic signal processing circuit when the fail-safe circuit detects that the differential input signals have nonstandard small amplitude in response to the fail-safe detection signal, and wherein the fail-safe circuit comprises:

a high-pass filter that removes DC components from the differential input signals and outputs a high voltage input signal and a low voltage input signal respectively corresponding to the differential input signals;

a comparator that compares a voltage level of the high voltage input signal with a voltage level of the low voltage input signal, and outputs a comparison result signal indicating a comparison result thereof; and a pulse width extending circuit that extends a pulse width of a voltage level of the comparison result signal indicating that the voltage level of the high voltage input signal is lower than the voltage level of the low voltage input signal, by a predetermined period of time, and outputs an obtained signal as the fail-safe detection signal.

Additionally, one or more embodiments of the present invention provide a fail-safe circuit that detects whether or not differential input signals having nonstandard small amplitude comply with a predetermined standard, and outputs a fail-safe detection signal indicating a detection result thereof, the fail-safe circuit comprising:

a high-pass filter that removes DC components from the differential input signals and outputs a high voltage input signal and a low voltage input signal respectively corresponding to the differential input signals;

a comparator that compares a voltage level of the high voltage input signal with a voltage level of the low voltage input signal, and outputs a comparison result signal indicating a comparison result thereof; and a pulse width extending circuit that extends a pulse width of a voltage level of the comparison result signal indicating that the voltage level of the high voltage input signal is lower than the voltage level of the low voltage input signal, by a predetermined period of time, and outputs an obtained signal as the fail-safe detection signal.

The fail-safe circuit can handle the differential input signals with input frequency bands of 20 MHz to 160 MHz for an LVDS data receiver. In addition, the fail-safe circuit can respond to the differential input signals having normal amplitude with high (sharp) sensitivity to determination of normal operation, and can respond to the differential input signals having LVDS nonstandard small amplitude with low (dull) sensitivity to determination of fail-safe operation.

Further, since the fail-safe circuit can be implemented with a simple configuration, it is possible to perform a low voltage operation that consumes low power and minimal area. Furthermore, the fail-safe circuit is hardly influenced by a process variation, and can minimize a gray zone which is a range of threshold value of normal amplitude and small amplitude of the differential input signals.

Moreover, it is possible to freely change frequency bands of the differential input signals by changing constants of the AC coupling capacitor and the resistive elements forming the high-pass filter. In addition, it is possible to freely set sensitivity to determination of normal operation or fail-safe operation by adjusting a constant of the pulse width extending circuit. For this reason, the fail-safe circuit is also applicable to a range that exceeds a specification of a data receiver for LVDS.

DETAILED DESCRIPTION OF THE INVENTION

Hereinafter, a data receiver and a fail-safe circuit according to one or more embodiments of the present invention will be described in congruence with the drawings.

Figure 1:
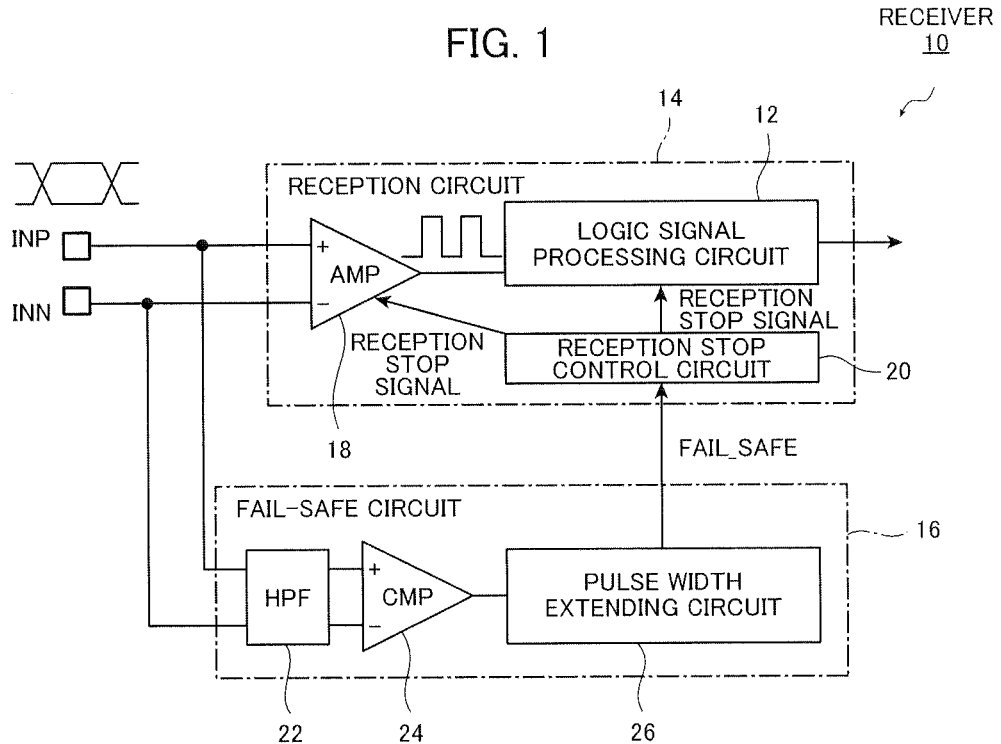
FIG. 1 is a block diagram illustrating a configuration of a data receiver according to one or more embodiments of the present invention.

FIG. 1 is a block diagram illustrating a configuration of a data receiver according to one or more embodiments of the present invention. A data receiver 10 illustrated in FIG. 1 receives serial data of differential input signals INP and INN based on an LVDS standard from a data transceiver (not illustrated), converts the serial data into serial data of a single-end output signal, and supplies the serial data to a logic signal processing circuit 12 which processes the serial data. The data receiver 10 may include a reception circuit 14 and a fail-safe circuit 16.

The reception circuit 14 receives serial data of the differential input signals INP and INN, converts the serial data into serial data of a single-ended output signal, and supplies the serial data to a subsequent circuit. The reception circuit 14 includes an input amplifier portion 18, a logic signal processing circuit 12, and a reception stop control circuit 20.

The input amplifier portion 18 receives serial data of differential input signals INP and INN and outputs serial data of a single-ended output signal, and may further include a differential amplifier (AMP).

The logic signal processing circuit 12 processes the serial data, which is output from the input amplifier portion 18. The logic signal processing circuit 12 then outputs the processed serial data to a subsequent circuit.

The reception stop control circuit 20 outputs a reception stop signal in response to a fail-safe detection signal FAIL_SAFE input from the fail-safe circuit 16 in a case where it is detected that the differential input signals INP and INN have small amplitude not based on an LVDS standard (hereinafter, abbreviated as LVDS nonstandard small amplitude). Said in other words, when the differential input signals fail, the input amplifier portion 18 and the logic signal processing circuit 12 of the reception circuit 14 are powered down and disabled.

Next, the fail-safe circuit 16 detects whether or not the differential input signals INP and INN have LVDS nonstandard small amplitude. Specifically, the fail-safe circuit 16 detects whether the differential input signals INP and INN fail or not, and outputs the fail-safe detection signal FAIL_SAFE indicating a detection result thereof. The fail-safe circuit 16 may include a high-pass filter (HPF) 22, a comparator (CMP) 24, a pulse width extending circuit 26, and a NOR circuit 28.

Figure 2:
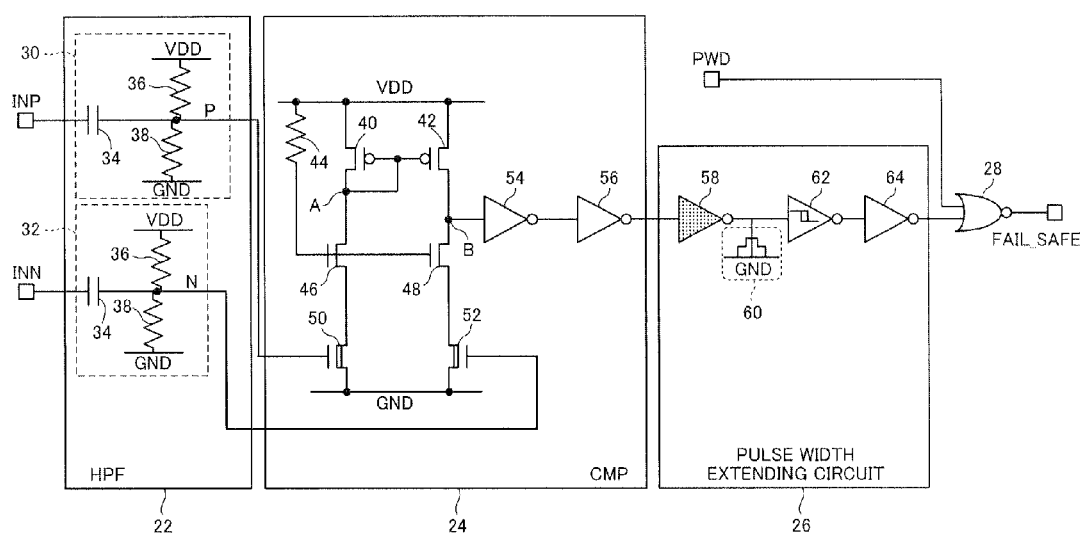
FIG. 2 is a circuit diagram illustrating an example of a configuration of the fail-safe circuit according to one or more embodiments of the present invention.

The high-pass filter 22 removes DC components from the differential input signals INP and INN, and, with respect to the remaining AC components of the input signals INP and INN, outputs a signal obtained by superimposing one of the remaining AC components of the input signals INP and INN on a new common mode of high voltage (hereinafter, referred to as a high voltage input signal P) and a signal obtained by superimposing the other of the remaining AC components of the input signals INP and INN on a new common mode of low voltage (hereinafter, referred to as a low voltage input signal N). As illustrated in FIG. 2, for example, the high-pass filter 22 may include a filter 30 and a filter 32, which correspond to the input signals NP and INN respectively.

The filter 30 may include an AC coupling capacitor 34 and two resistive elements 36 and 38. The AC coupling capacitor 34 is AC-coupled between the differential input signal INP and the high voltage input signal P. The resistive element 36 is connected between a power supply VDD and the high voltage input signal P, and the resistive element 38 is connected between the high voltage input signal P and a ground GND.

In the filter 30, a DC component of the differential input signal INP is removed by the AC coupling capacitor 34, and the high voltage input signal P, which is obtained by superimposing a desired new common mode of high voltage VCP on an AC component that remains after the DC component is removed, is generated by the resistive elements 36 and 38.

The filter 32 is substantially the same as the filter 30. A DC component of the differential input signal INN is removed by the AC coupling capacitor 34, and the low voltage input signal N, which is obtained by superimposing a desired new common mode of low voltage VCN on an AC component that remains after the DC component is removed, is generated by the resistive elements 36 and 38.

Figure 3A:
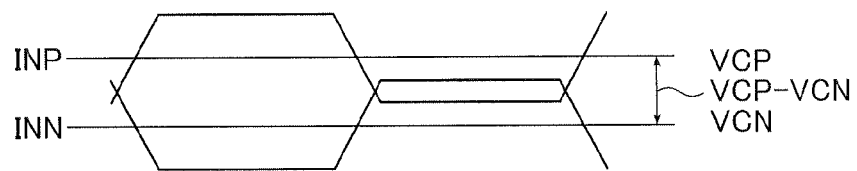
FIG. 3A is a timing diagram illustrating an example of a waveform of functioning differential input signals according to one or more embodiments of the present invention.

As illustrated in FIG. 3A, in a case where the differential input signals INP and INN do not have LVDS nonstandard small amplitude (i.e., when the high voltage input signal P and the low voltage input signal N have normal amplitude), a low voltage level of the high voltage input signal P is lower than a high voltage level of the low voltage input signal N when the high voltage input signal P is in a low voltage level and the low voltage input signal N is in a high voltage level.

Figure 3B:
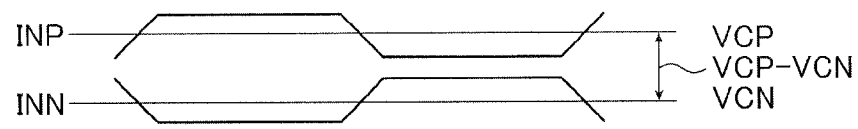
FIG. 3B is a timing diagram illustrating an example of a waveform of failed differential input signals according to one or more embodiments of the present invention.

On the other hand, as illustrated in FIG. 3B, for example, in a case where the differential input signals INP and INN have LVDS nonstandard small amplitude (i.e., when the high voltage input signal P and the low voltage input signal N have amplitude smaller than normal amplitude), a voltage level of the high voltage input signal P is higher than a voltage level of the low voltage input signal N, regardless of voltage levels of the high voltage input signal P and the low voltage input signal N.

The comparator 24 compares a voltage level of the high voltage input signal P with a voltage level of the low voltage input signal N, and outputs a comparison result signal indicating a comparison result thereof. As illustrated in FIG. 2, for example, the comparator 24 may include two PMOS transistors (P type MOS transistors) 40 and 42, a resistive element 44, two NMOS transistors (N type MOS transistors) 46 and 48, two NMOS transistors 50 and 52, and two inverters 54 and 56.

The PMOS transistor 40 and the NMOS transistors 46 and 50 are connected in series between the power supply VDD and the ground GND; and, similarly, the PMOS transistor 42 and the NMOS transistors 48 and 52 are connected in series between the power supply VDD and the ground GND. Gates of the PMOS transistors 40 and 42 are connected to a node A between a drain of the PMOS transistor 40 and a drain of the NMOS transistor 46, so as to form a current mirror circuit. Gates of the NMOS transistors 46 and 48 are connected to the power supply VDD via the resistive element 44. The high voltage input signal P and the low voltage input signal N are respectively input to gates of the NMOS transistors 50 and 52. A comparison result signal is output from a node B between a drain of the PMOS transistor 42 and a drain of the NMOS transistor 48 via the inverters 54 and 56, which are connected in series.

In the comparator 24, in a case where a voltage level of the high voltage input signal P is higher than a voltage level of the low voltage input signal N, the NMOS transistor 50 is turned on stronger than the NMOS transistor 52, and thus a voltage level of the node A is lower than a voltage level of the node B. Consequently, an H (high level) is output as a comparison result signal.

On the other hand, in a case where a voltage level of the high voltage input signal P is lower than a voltage level of the low voltage input signal N, the NMOS transistor 52 is turned on stronger than the NMOS transistor 50, and thus a voltage level of the node B is lower than a voltage level of the node A. Consequently, an L (low level) is output as a comparison result signal.

The pulse width extending circuit 26 extends a pulse width of a voltage level of a comparison result signal indicating that a voltage level of the high voltage input signal P is lower than a voltage level of the low voltage input signal N, by a predetermined period of time, and outputs an obtained signal as the fail-safe detection signal FAIL_SAFE. As illustrated in FIG. 2, for example, the pulse width extending circuit 26 may include an unbalanced inverter 58, a load capacitor 60, a Schmitt trigger inverter 62, and an inverter 64.

Figure 4:
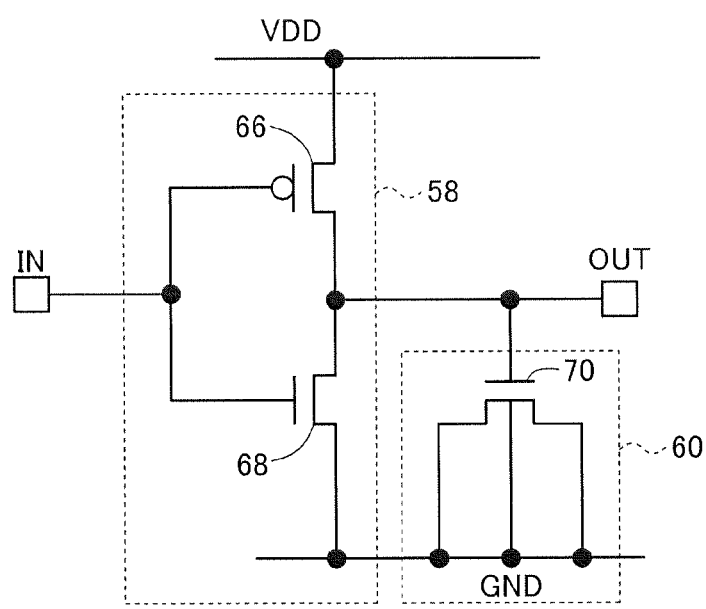
FIG. 4 is a circuit diagram illustrating an example of a configuration of an unbalanced inverter and a load capacitor according to one or more embodiments of the present invention.

The unbalanced inverter 58 reverses and outputs a comparison result signal, and may include a PMOS transistor 66 and an NMOS transistor 68 as illustrated in, for example, FIG. 4.

The PMOS transistor 66 drives a comparison result signal from a first voltage level indicating that a voltage level of the high voltage input signal P is higher than a voltage level of the low voltage input signal N to a second voltage level indicating that a voltage level of the high voltage input signal P is lower than a voltage level of the low voltage input signal N.

The NMOS transistor 68 drives the comparison result signal from the second voltage level to the first voltage level.

In addition, the drivability of the PMOS transistor 66 is higher than the drivability of the NMOS transistor 68. The drivability can be adjusted by changing, for example, sizes of the PMOS transistor 66 and the NMOS transistor 68.

The PMOS transistor 66 and the NMOS transistor 68 are connected in series to each other between the power supply VDD and the ground GND, and gates thereof are connected to an input terminal IN of the unbalanced inverter 58, and drains thereof are connected to an output terminal OUT of the unbalanced inverter 58.

Since the drivability of the PMOS transistor 66 is higher than the drivability of the NMOS transistor 68, an output signal of the unbalanced inverter 58 rises quickly from L to H if an input signal of the unbalanced inverter 58 changes from H to L and falls slowly from H to L if the input signal changes from L to H.

For this reason, a period of time in which the output signal of the unbalanced inverter 58 becomes H is extended, and a period of time in which the output signal becomes L is reduced.

The load capacitor 60 is a capacitor connected to the output signal of the unbalanced inverter 58, and may include an NMOS transistor 70 as shown, for example, in FIG. 4.

A source, a drain, and a substrate of the NMOS transistor 70 are connected to the ground GND, and a gate thereof is connected to the output signal of the unbalanced inverter 58, so as to form a MOS capacitor. A capacitance value of the MOS capacitor can be adjusted by changing, for example, the size of the NMOS transistor 70.

The load capacitor 60 is connected to the output signal of the unbalanced inverter 58, and thus it is possible to dull the output signal of the unbalanced inverter 58. As a result, a period of time in which the output signal becomes H is further extended, and a period of time in which the output signal becomes L is further reduced.

Figure 5:
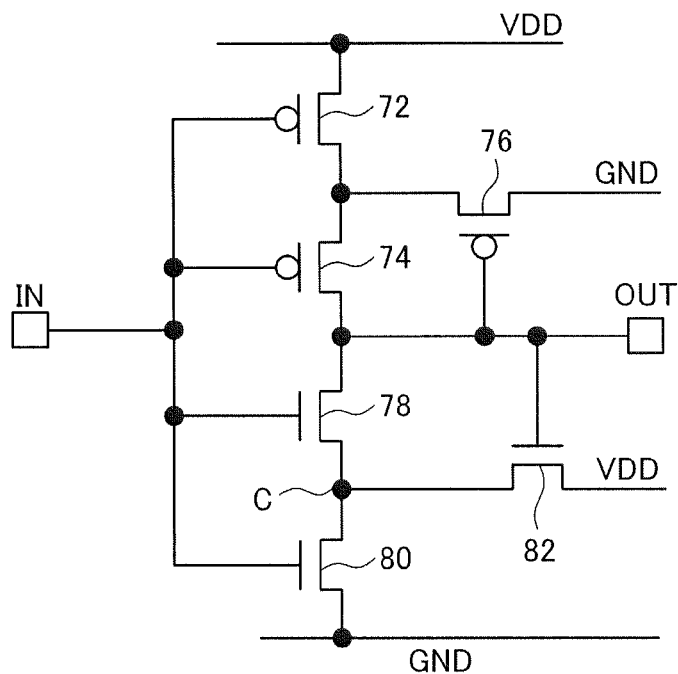
FIG. 5 is a circuit diagram illustrating an example of a configuration of a Schmitt trigger inverter according to one or more embodiments of the present invention.

The Schmitt trigger inverter 62 reverses and outputs the output signal of the unbalanced inverter 58, and may include three PMOS transistors 72, 74 and 76, and three NMOS transistors 78, 80 and 82 as shown in, for example, FIG. 5.

The PMOS transistors 72 and 74 and the NMOS transistors 78 and 80 are connected in series between the power supply VDD and the ground GND. Gates of the PMOS transistors 72 and 74 and the NMOS transistors 78 and 80 are connected to the input terminal IN of the Schmitt trigger inverter 62, and drains of the PMOS transistor 74 and the NMOS transistor 78 are connected to the output terminal OUT of the Schmitt trigger inverter 62.

The PMOS transistor 76 is connected between the drain of the PMOS transistor 72 and the ground GND, and a gate thereof is connected to the output terminal OUT of the Schmitt trigger inverter 62.

The NMOS transistor 82 is connected between the drain of the NMOS transistor 80 and the power supply VDD, and a gate thereof is connected to the output terminal OUT of the Schmitt trigger inverter 62.

Figure 8:
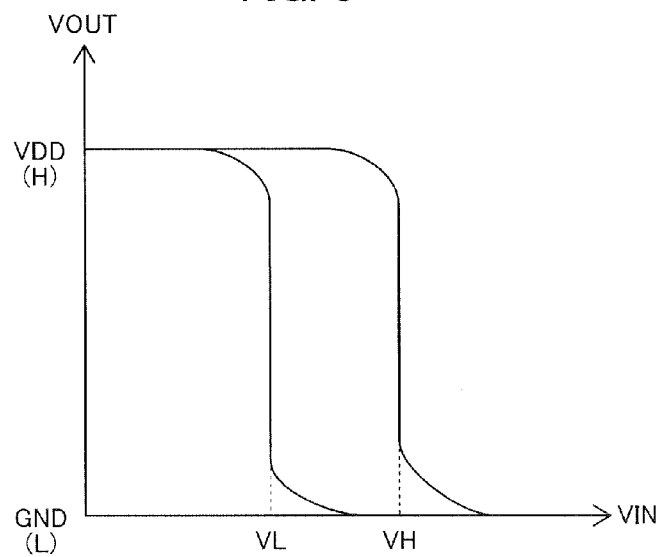
FIG. 8 is a timing diagram illustrating an example of an operation of the Schmitt trigger inverter.

In the Schmitt trigger inverter 62, as shown for example in FIG. 8, in a case where an input signal from the input terminal IN changes from L to H, the PMOS transistor 76 is off, and the PMOS transistors 72 and 74 are turned off when a voltage level VIN of the input signal becomes a threshold value. In addition, the NMOS transistor 80 is turned on when the voltage level VIN of the input signal meets a threshold value. On the other hand, since a voltage level of a node C between the source of the NMOS transistor 78 and the drain of the NMOS transistor 80 becomes higher than the ground GND when the NMOS transistor 82 is on, the NMOS transistors 78 are turned on when the voltage level VIN of the input signal becomes VH higher than the threshold value. If the NMOS transistor 78 is turned on, an output signal from the output terminal OUT changes from H to L, and thus the PMOS transistor 76 is turned on and the NMOS transistor 82 is turned off.

On the other hand, in a case where the input signal changes from H to L, similarly, when the voltage level VIN of the input signal becomes VL lower than the threshold value when the PMOS transistor 76 is on, the output signal changes from L to H, and thus the PMOS transistor 76 is turned off and the NMOS transistor 82 is turned on.

In other words, the duration when a voltage level of the input signal changes from VL to VH and the duration when the voltage level thereof changes from VH to VL become hysterisys voltages in which the output signal does not change. Therefore, for example, the output signal can be prevented from frequently changing due to a change in the input signal caused by influence of noise or the like, and a waveform of the input signal can be shaped.

In a case where a low voltage level of the high voltage input signal P is higher than a high voltage level of the low voltage input signal N in normal operation, a pulse width of the comparison result signal decreases if a difference between both of the voltage levels decreases, and the pulse width thereof increases if a difference between both of the voltage levels increases.

In the fail-safe circuit 16, since a pulse width of the comparison result signal is extended by the pulse width extending circuit 26, even if a pulse width of the comparison result signal is small in normal operation, the comparison result signal can be identified and a pulse width can be extended.

An output signal of the pulse width extending circuit 26 and a fail-safe function stop control signal PWD are input to the NOR circuit 28, and the fail-safe detection signal FAIL_SAFE is output from the NOR circuit 28.

The fail-safe function stop control signal PWD is a signal that forces the fail-safe circuit 16 to be powered down and disabled, and is typically L.

Therefore, in a case where the fail-safe function stop control signal PWD is L, the output signal of the pulse width extending circuit 26 is reversed to be output as the fail-safe detection signal FAIL_SAFE by the NOR circuit 28 (that is, a fail-safe function is enabled).

If the fail-safe function stop control signal PWD becomes H, an output signal of the NOR circuit 28 (i.e., the fail-safe detection signal FAIL_SAFE) is forced to become L. This scenario leads to the same state as indicating that the differential input signals INP and INN do not have LVDS nonstandard small amplitude (that is, the fail-safe function is disabled).

Next, an operation of the data receiver 10 is described.

In a case where the differential input signals INP and INN have normal amplitude, the comparison result signal becomes H when the high voltage input signal P becomes a high voltage level and the low voltage input signal N becomes a low voltage level, and the comparison result signal becomes L when the high voltage input signal P becomes a low voltage level, and the low voltage input signal N becomes a high voltage level.

Figure 6:
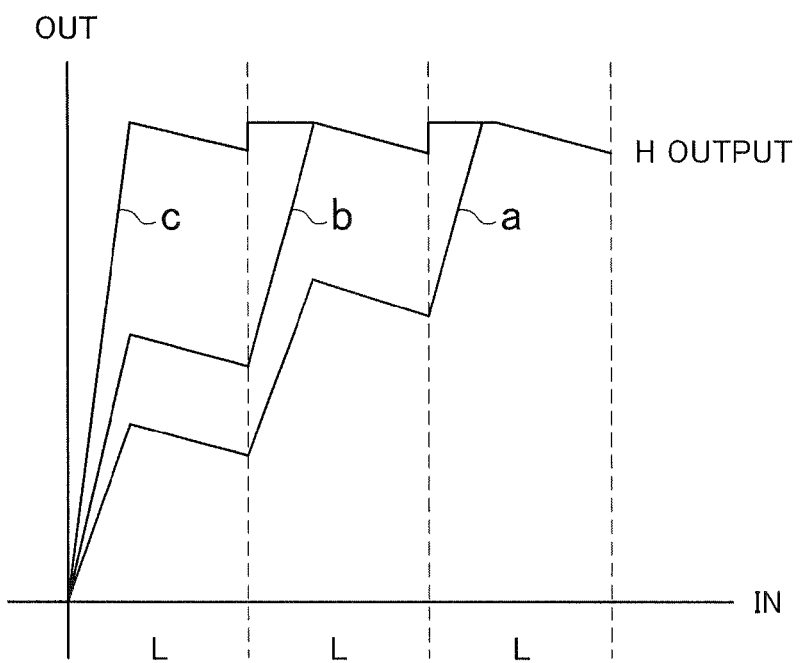
FIG. 6 is a timing diagram illustrating an example of how an output signal of the unbalanced inverter changes according to one or more embodiments of the present invention.

In this case, as shown for example in FIG. 6, when the comparison result signal becomes L, an output signal of the unbalanced inverter 58 is driven to rise quickly from L to H by the PMOS transistor 66 having the high drivability, and, successively, when the comparison result signal becomes H, an output signal of the unbalanced inverter 58 is driven to fall slowly from H to L by the NMOS transistor 68 having the low drivability. This operation is repeated.

As mentioned above, in a case where the comparison result signal repeatedly changes between L and H, an output signal of the unbalanced inverter 58 is maintained in H. Therefore, an output signal of the Schmitt trigger inverter 62 becomes L, an output signal of the inverter 64 becomes H, and the fail-safe detection signal FAIL_SAFE becomes L. Thus, the reception circuit 14 is functioning.

In a case where the differential input signals INP and INN have LVDS nonstandard small amplitude, the comparison result signal is H at all times.

Figure 7:
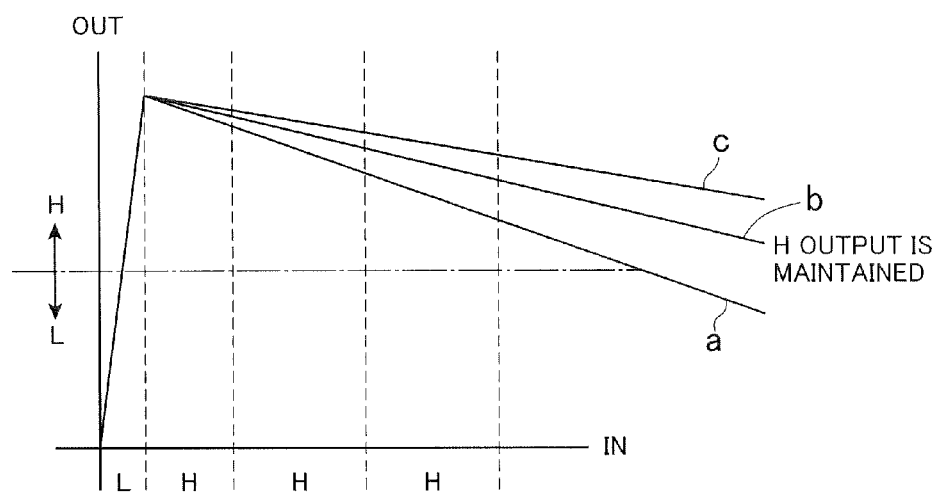
FIG. 7 is a timing diagram illustrating an example of a state in which an output signal of the unbalanced inverter changes according to one or more embodiments of the present invention.

In this case, as shown for example in FIG. 7, when the comparison result signal becomes H, an output signal of the unbalanced inverter 58 is driven to fall slowly from H to L by the NMOS transistor 68 having the low drivability.

As mentioned above, in a case where the comparison result signal repeatedly outputs H, an output signal of the unbalanced inverter 58 is kept H for a predetermined period of time, but then becomes L. Therefore, assuming that an output signal of the Schmitt trigger inverter 62 is H, an output signal of the inverter 64 is L, and the fail-safe function stop control signal PWD is L, the fail-safe detection signal FAIL_SAFE becomes H so that the fail-safe function is enabled, and the input amplifier portion 18 and the logic signal processing circuit 12 of the reception circuit 14 are disabled by a reception stop signal from the reception stop control circuit 20.

As mentioned above, by disabling the reception circuit 14 so that the differential input signals INP and INN not based on the LVDS standard are not received by the reception circuit 14, it is possible to prevent the reception circuit 14 and subsequent circuits from malfunctioning.

In the fail-safe circuit 16, even if the differential input signals INP and INN have LVDS nonstandard small amplitude, for example, a fail-safe function is not enabled by a failure occurring for only one cycle. In a case where a failure occurs for several cycles within a predetermined period of time, the fail-safe operation is enabled. For this reason, it is possible to determine whether the circuit is in a normal operation or a fail-safe operation.

The predetermined period of time may be appropriately set (changed) depending on a capacitance value of the load capacitor 60 along with the drivability of the PMOS transistor 66 and the NMOS transistor 68 included in the unbalanced inverter 58.

For example, by increasing the drivability of the PMOS transistor 66, rising of the output signal of the unbalanced inverter 58 can be made faster in an order of c, b, and a, as illustrated in FIG. 6 for example, in accordance with the increase thereof. Thus, it is possible to appropriately change the number of clock cycles of serial data required for the output signal of the unbalanced inverter 58 to change from L to H.

On the other hand, by decreasing the drivability of the NMOS transistor 68, falling of the output signal of the unbalanced inverter 58 can be made slowly in an order of a, b, and c, as illustrated in FIG. 7 for example, in accordance with the decrease thereof. Thus, it is possible to appropriately change the number of clock cycles of serial data required for the output signal of the unbalanced inverter 58 to change from H to L.

In addition, it is possible to make rising and falling of the output signal of the unbalanced inverter 58 more slowly by increasing the capacitance value of the load capacitor 60.

The fail-safe circuit 16 can handle the differential input signals INP and INN with input frequency bands of 20 MHz to 160 MHz for an LVDS data receiver. In addition, the fail-safe circuit 16 can respond to the differential input signals INP and INN having normal amplitude with high (sharp) sensitivity to determination of normal operation, and can respond to the differential input signals INP and INN having LVDS nonstandard small amplitude with low (dull) sensitivity to determination of fail-safe operation.

Further, since the high-pass filter 22, the comparator 24, and the pulse width extending circuit 26 forming the fail-safe circuit 16 can be implemented with a simple configuration, it is possible to perform a low voltage operation that consumes low power and minimal area. Furthermore, the fail-safe circuit 16 is minimally affected by a process variation, and can minimize a gray zone that is a range of threshold value of normal amplitude and small amplitude of the differential input signals INP and INN.

Moreover, it is possible to freely change frequency bands of the differential input signals INP and INN by changing constants of the AC coupling capacitor 34 and the resistive elements 36 and 38 forming the high-pass filter 22. In addition, as described above, it is possible to freely set sensitivity to determination of normal operation or fail-safe operation by adjusting a constant of the pulse width extending circuit 26. For this reason, the fail-safe circuit 16 is also applicable to a range that exceeds a specification of a data receiver for LVDS.

Specific configurations of the input amplifier portion 18, the logic signal processing circuit 12, and the reception stop control circuit 20 forming the reception circuit 14, and the high-pass filter 22, the comparator 24, and the pulse width extending circuit 26 forming the fail-safe circuit 16 are not limited to what has been described above. One of ordinary skill in the art would appreciate that various configurations possessing substantially the same functions are possible without departing from the scope of the invention.

Further, signal polarities of the detection result signal, the output signal of the pulse width extending circuit 26, the fail-safe detection signal FAIL_SAFE, and the like do not limit the scope of the invention. One of ordinary skill in the art would appreciate that the configuration of each circuit can be changed so that it is suitable for the polarities of each signal.

Furthermore, the load capacitor 60, the Schmitt trigger inverter 62, the NOR circuit 28 are not essential elements of the fail-safe circuit 16, and may be appropriately provided or omitted as necessary.

Although the foregoing examples have been described in some detail for purposes of clarity of understanding, the invention is not limited to the details provided. There are many alternative ways of implementing the invention. The disclosed embodiments are illustrative and not restrictive.

What is claimed is:

1. A data receiver comprising:
   a reception circuit that receives a serial data of differential input signals based on a predetermined standard, converts the serial data into a serial data of a single-ended output signal, and outputs a converted serial data; and
   a fail-safe circuit that detects whether the differential input signals have a nonstandard small amplitude, and outputs a fail-safe detection signal indicating a detection result thereof,
   wherein the reception circuit comprises:
   an input amplifier portion that receives the serial data of the differential input signals, converts the serial data into the serial data of the single-ended output signal, and outputs the converted serial data;
   a logic signal processing circuit that processes the converted serial data; and
   a reception stop control circuit that disables the input amplifier and the logic signal processing circuit when the fail-safe circuit detects that the differential input signals have nonstandard small amplitude in response to the fail-safe detection signal, and
   wherein the fail-safe circuit comprises:
   a high-pass filter that removes DC components from the differential input signals and outputs a high voltage input signal and a low voltage input signal respectively corresponding to the differential input signals;
   a comparator that compares a voltage level of the high voltage input signal with a voltage level of the low voltage input signal, and outputs a comparison result signal indicating a comparison result thereof; and
   a pulse width extending circuit that extends a pulse width of a voltage level of the comparison result signal indicating that the voltage level of the high voltage input signal is lower than the voltage level of the low voltage input signal, by a predetermined period of time, and outputs an obtained signal as the fail-safe detection signal.

2. The data receiver according to claim 1,
   wherein the pulse width extending circuit comprises an unbalanced inverter that reverses and outputs the comparison result signal,
   wherein the unbalanced inverter comprises
   a first transistor that drives the comparison result signal from a first voltage level indicating that the voltage level of the high voltage input signal is higher than the voltage level of the low voltage input signal to a second voltage level indicating that the voltage level of the high voltage input signal is lower than the voltage level of the low voltage input signal; and
   a second transistor that drives the comparison result signal from the second voltage level to the first voltage level, and
   wherein a drivability of the first transistor is higher than a drivability of the second transistor.

3. The data receiver according to claim 2, wherein the predetermined period of time is determined based on the drivability of the first and second transistors of the unbalanced inverter.

4. The data receiver according to claim 2, wherein the pulse width extending circuit further comprises a load capacitor that is operatively connected to an output signal of the unbalanced inverter.

5. The data receiver according to claim 4, wherein the predetermined period of time is determined based on the drivability of the first and second transistors of the unbalanced inverter and a capacitance value of the load capacitor.

6. The data receiver according to claim 2, wherein the pulse width extending circuit further comprises a Schmitt trigger inverter that reverses and outputs an output signal of the unbalanced inverter.

7. The data receiver according to claim 1, wherein the differential input signals are based on a low voltage differential signaling standard.

8. A fail-safe circuit that detects whether differential input signals having a nonstandard small amplitude comply with a predetermined standard, and outputs a fail-safe detection signal indicating a detection result thereof, the fail-safe circuit comprising:
- a high-pass filter that removes DC components from the differential input signals and outputs a high voltage input signal and a low voltage input signal respectively corresponding to the differential input signals;
- a comparator that compares a voltage level of the high voltage input signal with a voltage level of the low voltage input signal, and outputs a comparison result signal indicating a comparison result thereof; and
- a pulse width extending circuit that extends a pulse width of a voltage level of the comparison result signal indicating that the voltage level of the high voltage input signal is lower than the voltage level of the low voltage input signal, by a predetermined period of time, and outputs an obtained signal as the fail-safe detection signal, wherein the pulse width extending circuit comprises an unbalanced inverter that reverses and outputs the comparison result signal, wherein the unbalanced inverter comprises:
- a first transistor that drives the comparison result signal from a first voltage level indicating that the voltage level of the high voltage input signal is higher than the voltage level of the low voltage input signal to a second voltage level indicating that the voltage level of the high voltage input signal is lower than the voltage level of the low voltage input signal; and
- a second transistor that drives the comparison result signal from the second voltage level to the first voltage level, and wherein a drivability of the first transistor is higher than a drivability of the second transistor.

9. The fail-safe circuit according to claim 8, wherein the predetermined period of time is determined based on the drivability of the first and second transistors of the unbalanced inverter.

10. The fail-safe circuit according to claim 8, wherein the pulse width extending circuit further comprises a load capacitor that is operatively connected to an output signal of the unbalanced inverter.

11. The fail-safe circuit according to claim 10, wherein the predetermined period of time is determined based on the drivability of the first and second transistors of the unbalanced inverter and a capacitance value of the load capacitor.

12. The fail-safe circuit according to claim 8, wherein the pulse width extending circuit further comprises a Schmitt trigger inverter that reverses and outputs an output signal of the unbalanced inverter.

13. The fail-safe circuit according to claim 8, wherein the differential input signals are based on a low voltage differential signaling standard.

\* \* \* \* \*